US008228582B1

(12) United States Patent
Pepper et al.

(10) Patent No.: US 8,228,582 B1
(45) Date of Patent: Jul. 24, 2012

(54) OPTICAL RETRO-REFLECTIVE APPARATUS WITH MODULATION CAPABILITY

(75) Inventors: David M. Pepper, Malibu, CA (US); Keyvan Sayyah, Santa Monica, CA (US)

(73) Assignee: HRL Laboratories, LLC, Malibu, CA (US)

(*) Notice: Subject to any disclaimer, the term of this patent is extended or adjusted under 35 U.S.C. 154(b) by 20 days.

(21) Appl. No.: 12/757,926

(22) Filed: Apr. 9, 2010

Related U.S. Application Data

(62) Division of application No. 10/661,028, filed on Sep. 11, 2003, now Pat. No. 7,729,030.

(60) Provisional application No. 60/420,177, filed on Oct. 21, 2002.

(51) Int. Cl.
*G02F 3/00* (2006.01)
*G02B 26/08* (2006.01)
*G02B 26/10* (2006.01)
*G02B 26/12* (2006.01)

(52) U.S. Cl. ............. 359/212.1; 359/212.2; 359/217.2

(58) Field of Classification Search ............ 359/212.1, 359/212.2, 216.1, 219.1, 219.2, 217.2, 223.1, 359/224.1, 224.2
See application file for complete search history.

(56) References Cited

U.S. PATENT DOCUMENTS

| | | | |
|---|---|---|---|
| 3,980,818 A | 9/1976 | Browning | 369/30.04 |
| 5,062,684 A | 11/1991 | Clayton et al. | 385/27 |
| 5,066,130 A | 11/1991 | Tsukiji et al. | 356/494 |
| 5,130,843 A | 7/1992 | He et al. | |
| 5,172,262 A | 12/1992 | Hornbeck | 359/223 |
| 5,208,886 A | 5/1993 | Clayton et al. | 385/73 |
| 5,315,430 A | 5/1994 | Brennan et al. | 359/248 |
| 5,412,499 A | 5/1995 | Chiu et al. | 359/248 |
| 5,426,312 A | 6/1995 | Whitehead | |
| 5,488,504 A | 1/1996 | Worchesky et al. | |
| 5,777,318 A | 7/1998 | Krishnamoorthy et al. | 250/214 LS |
| 5,808,797 A | 9/1998 | Bloom et al. | 359/572 |
| 5,909,303 A | 6/1999 | Trezza et al. | |
| 5,966,227 A | 10/1999 | Dubois et al. | 359/170 |
| 6,154,299 A | 11/2000 | Gilbreath et al. | 359/170 |
| 6,439,728 B1 | 8/2002 | Copeland | 359/515 |
| 6,455,931 B1 | 9/2002 | Hamilton, Jr. et al. | 257/723 |

(Continued)

FOREIGN PATENT DOCUMENTS

EP    2159621 A1    3/2010
(Continued)

OTHER PUBLICATIONS

Biermann, M.L., et al., "Design and Analysis of a Diffraction-Limited Cat's-Eye Retroreflector," Opt. Eng., vol. 41, No. 7, pp. 1655-1660 (Jul. 2002).

(Continued)

Primary Examiner — Thomas K Pham
Assistant Examiner — Brandi Thomas
(74) Attorney, Agent, or Firm — Ladas & Parry

(57) ABSTRACT

An optical MEMS retro-reflective apparatus with modulation capability having a retro-reflecting structure including a pair of reflective surfaces; and a MEMS device for moving at least one of the reflective surfaces of said pair of reflective surfaces relative to another one of the reflective surfaces of said pair of reflective surfaces a distance which causes the pair of reflective surfaces to switch between a reflective mode of operation and a transmissive mode of operation. A substrate and a moveable grating structure may be substituted for the reflective surfaces.

16 Claims, 5 Drawing Sheets

U.S. PATENT DOCUMENTS

| | | | |
|---|---|---|---|
| 6,538,800 B2 | 3/2003 | Huibers | |
| 6,597,490 B2 | 7/2003 | Tayebati | |
| 6,831,769 B2 | 12/2004 | Holman et al. | |
| 7,085,492 B2 | 8/2006 | Ibsen et al. | 398/38 |
| 7,142,348 B2 | 11/2006 | Sayyah et al. | |
| 7,729,030 B2 | 6/2010 | Pepper | |
| 2001/0011712 A1* | 8/2001 | Castenmiller et al. | 250/548 |
| 2002/0001046 A1 | 1/2002 | Jacobsen et al. | |
| 2003/0231692 A1 | 12/2003 | Belikov et al. | 372/102 |
| 2004/0075880 A1 | 4/2004 | Pepper et al. | |
| 2004/0114210 A1 | 6/2004 | Fitzpatrick | |
| 2004/0126050 A1 | 7/2004 | Claydon et al. | 385/14 |
| 2004/0130769 A1* | 7/2004 | Sayyah et al. | 359/240 |

FOREIGN PATENT DOCUMENTS

| | | |
|---|---|---|
| JP | 2004-138996 | 12/2002 |
| WO | 98/35328 | 8/1998 |

OTHER PUBLICATIONS

Encyclopedia of Lasers and Optical Technology, "Fiber-Optic Based Smart Structures," p. 93, and p. 382.

U.S. Appl. No. 10/690,486, filed Oct. 20, 2003, Sayyah et al.

* cited by examiner

OPTICAL RETRO-REFLECTIVE APPARATUS WITH MODULATION CAPABILITY

CROSS-REFERENCE TO RELATED APPLICATIONS

This application is a divisional of U.S. patent application Ser. No. 10/661,028, filed on Sep. 11, 2003 now U.S. Pat. No. 7,729,030, and is related to U.S. provisional patent application No. 60/420,177 filed Oct. 21, 2002, the disclosure of which is hereby incorporated herein by reference.

TECHNICAL FIELD

This invention relates to an optical retro-reflector device with modulation capability preferably in the kHz to MHz range (or even greater). This device is compact and rugged and can be used in a variety of communication, interconnect, and remote sensing applications. Clusters of several retro devices on a common platform can be used to address a large field of view. A similar cluster can also be used to provide for additional wavefront correction beyond tilt-error compensation (i.e., wavefront errors of odd order in phase), forming a so-called "pseudo-conjugator." The retro-modulator can be functional in visible, IR, or mid-IR portions of the spectrum, depending on the materials and coatings employed. The disclosed devices preferably utilize MEMS-based technology to alter the retro-reflective nature of the disclosed devices.

BACKGROUND OF THE INVENTION

A retro-modulation device with modulation capability, as disclosed herein, includes a compact, monolithic optical MEMS structure, which uses mechanical motion, induced electrostatically or thermally, to displace various components of the structure for the modulation encoding. In general, retrorellectors have the property of taking an incident optical (or RF) beam received from a source and redirecting the beam back to the source via a sequence of reflections within the retro-device. As such, retro-reflective devices, in essence, "track" the source location and thus provide auto-compensation for beam wander, relative platform motion and wobble. In addition, by encoding a modulation signal at (or within) the retro-reflective device, the return beam can be encoded with the information from the modulation signal. In this manner, information can be directed from a remote site back to the location of an interrogation or source beacon without the need for an optical (or RF) source or transmitter at the remote site. Retro-reflection and modulation devices have myriad applications to free-space links, optical interconnects, remote sensors, IFF/ID battlefield scenarios, guidance control for free-space or underwater platforms, etc.

The retro-reflecting structures can be in the form of a corner cube or cat's eye configuration as well as an array of such devices (the latter is referred to as a pseudo-conjugator). In either case, in accordance with the present invention, a modulation signal is used to displace the element(s) of the structure to, in essence, reversibly "defeat" the retro-directive capability of the device. The result is that the return beam returns back to the transceiver location as an amplitude-modulated beam or as an on-off digitally or binary modulated beam, bearing the desired encoded temporal information. Since the mechanical displacement is cyclical (billions of cycles have been demonstrated using optical MEMS devices in general), modulation information can be relayed using such a device with high reliability over a very long period of time. Modulation bandwidth in the range of kHz to many MHz are possible using this scheme.

Large arrays of retro-reflecting structures can be utilized as disclosed in U.S. provisional patent application Ser. No. 60/420,177 noted above.

Both types of retro-reflection devices (cat's eye and corner cube structures) are known, per se, in the prior art. Additionally, the four variations of optical switches subsequently discussed herein have also been discussed in the prior art. The present invention merges the two notions (retro-reflection devices with optical switching methods) to form a retro-modulator. This concept is not apparent to persons skilled in the art, since the primary applications of the four classes of switches have been presented by experts in the field in the context of high-definition display-mode devices (spatial light modulators, SLMs), high-density optical interconnection elements for telecommunications networks, wavelength divisional multiplexing (WDM) optical devices of high-density communication traffic networks and optical spectrometers. The notion of combining any of these switching approaches for use as modulated retro-devices is not known in the prior art. Therefore, the present invention is novel and, as discussed above and below, has myriad uses and applications in a variety of fields and scenarios. The disclosed retro-modulator should find itself very useful in many applications. For example, the disclosed retro-modulators can be used for combat ID/IFF, remote sensor optical links, interconnects, free-space links to communicate with missiles, high-speed smart projectiles, underwater devices, UAVs, and micro-UAVs, etc., and for communication links in general (telecommunication, wireless, interconnects, etc.). The disclosed retro-modulators can be used in connection with inter vehicle communication and accident avoidance tagging.

One object of this invention is to make it possible to realize a compact remote communication device, with modulation capability. The advantages of this invention include:

1. The disclosed retro-modulation devices are preferably passive; therefore the optical interrogation source needs only to be located at the interrogation/beacon site, and not necessarily at the retro-device location.
2. The disclosed retro-modulations device can be of rugged, lightweight, compact, low-power consuming, and low cost construction, yet it can operate at elevated temperatures.
3. MEMS devices, if used, can function at high-g values owing to their small sizes and mass, and their favorable mass to size ratio.
4. The retro nature of the device provides for automatic tilt error correction as well as automatic beam wander compensation (e.g., wobbling, relative platform motion).
5. The disclosed retro-modulation devices may be made very compactly using MEMS devices, for example, in combination with a variety of photonics components, such as detectors, optical elements, modulators, fibers and other integrated optical components, etc., with which the MEMS devices may be integrated and interfaced.
6. The disclosed retro-modulation devices can be fabricated using a variety of well known materials, such as Si, poly-Si, GaAs, InP, etc., and can be manufactured in high volume using commercially available technology.

Prior art includes conventional retro-reflectors with upstream external modulators (e.g., liquid crystals, MQWs, E-O crystals). In addition, the prior art includes phase-conjugate mirrors with modulation capability (via applied electric fields or modulated pump beams). The prior art also describes optical MEMS with a modulation capability.

It has been known in the prior art that a MEMS device can be associated with a retro-reflecting corner cube. By tilting one of the mirrors of the corner cube with desired modulation information, the retro-return property of the device can be controlled in a time-wise fashion. That is, the retro-aspect of the device can be defeated temporally (i.e., the reflected light no longer returns along the reverse direction from which the corner cube was illuminated). This results in apparent modulation of the light received back at the source location, since the light either returns back to its source location or is diverted over another path, according to the tilt of one of the mirrors in the corner cube device. A drawback is that a relatively large angular displacement of the corner cube mirror is necessary to divert the backward-propagating light beyond the diffraction spread of the small MEMS device. Assuming a 50 µm scale size, a 2° tilt is required to divert the reflected light away from its diffraction-limited return path to the sender. This implies a 2 µm displacement of the mirror edge, which is relatively large, and places demands on the device geometry, the drive voltage, its slew rate, etc., of the MEMS device controlling the mirror.

The present invention improves upon this existing art by imposing the modulation via a diffractive effect (or a displacement of a very small cantilever) or via an optical Fabry-Perot effect. Each effect can be utilized in either a cat's eye or a corner cube arrangement. In the disclosed embodiments, the required mechanical displacement can be as small as 100 nm, or only 5% of what the prior art requires. This implies that the required drive voltage or electrical drive current for the present invention would be only 5% of that required for the prior art devices, thereby reducing the drive power by the square of this ratio, potentially increasing the bandwidth of the modulation from the KHz to MHz. The required mechanical displacement is a small fraction of the wavelength of the light modulated by the disclosed devices.

Also, the present invention can lead to a larger depth-of-modulation for a given drive voltage. This follows since the beam in the "off-state" is deflected over a much greater angle for a given MEMS displacement (using, e.g., the diffraction-based embodiments of this invention). The same argument also applies to the Fabry-Perot embodiments. In both cases, this reduced MEMS displacement also enables the required drive voltage to be even less for the same depth-of-modulation performance, relative to the mirror-tilt-based corner cube (the prior art). In yet a third embodiment of this invention, a small MEMS cantilever is employed at the focal plane of a lens to encode the modulation information. In this case, the MEMS device can be much smaller than the tilt device in the corner cube geometry (e.g., 10 µm versus about 50 to 100 µm), resulting in a lower voltage and torque required for the modulation encoding. The prior art also includes O-MEMS for displays (TI's DMD SLMs using MEMS cantilevers; Silicon Light Machine's diffractive-based structures), and tunable MEMS optical filters for WDM. These devices pertain to large-screen, high-definition TV multi-pixel display systems or to add/drop devices, but not to retro-communication or remote sensing devices. The prior art does not discuss or imply the possibility of using these structures as elements for retro-devices or as retro-modulation devices, nor does the prior art imply this application or even imply how they can be designed or used for the devices disclosed herein.

Examples of prior art devices are shown in FIGS. 1, 2a and 2b. FIG. 1 shows a passive retro-reflector device 24 with an external modulator 22. The construction of the retro-device can be in the form of an embossed mold with a reflective coating (in the mid-IR range), a corner cube, a three-mirror structure, lens/mirror combination, or an array of the same. A corner cube is depicted in FIG. 1 for ease of illustration. The external modulator 22 can be in the form of an electro-optic amplitude or phase modulator (e.g., a liquid crystal) or a multi-quantum well electro-absorptive modulator.

A laser 10 forms a laser beam 12 which is directed to a communications retro-reflector 20. Reflector 20 houses the aforementioned passive retro-reflector device 24 and its associated external modulator 22. Beam 12 usually will have to transit a propagation path 14, as will a beam 12r reflected by retro-reflector 20. The reflected beam 12r is modulated with data by means of modulator 22. The modulated data is detected by a detector 18 and a beam splitter 18 may be conveniently used to separate the reflected beam 12r from the incident beam 12.

FIGS. 2a and 2b show additional prior art devices. In FIG. 2a, the retro-reflector device 24 is a monolithically fabricated optical MEMS structure using reflective elements to form the required device. In this case, the mirrors of a corner cube can be deflected (by tilting them on an axis 27) to defeat the retro-directive property of the corner cube 24 (effectively resulting in a modulated return beam). In FIG. 2a, a MEMS device 26 is used to move at least one of the mirrors (or other reflector element) 24a of a corner cube reflector 24. The MEMS device is responsive to a signal on line 20s for controlling the actuation of the MEMS device 26. By putting data on line 20s, the reflected signal is, in effect, modulated since a detector 18 would only "see" the reflected beam 12r when mirror 24a is in its "normal" position. In FIG. 2a dashed lines are used to illustrate movement of mirror 24a from is "normal" (solid line) portion to its actuated (dashed line) position. When mirror 24a is in its actuated position, the beam is deflected in a direction 12d which does not permit detection by detector 18. As discussed above, the relatively large size of this MEMS-activated mirror 24a, coupled with the constraint of having to deflect the beam over an angle d in excess of the diffraction-limited spread of the retro-directed beam, limits the modulation bandwidth for a given drive voltage and slew rate. This constraint is greatly relaxed using the embodiments of the present invention.

Another example of the prior art is shown in FIG. 2b, where a phase-conjugate mirror 25 is shown with an applied modulation capability (the modulation can be externally applied as in the case of FIG. 1). The conjugator wavefront reverses the incident beam 12 and produces a reflected beam 12r, while, at the same time, the modulator encodes temporal information onto this beam.

DESCRIPTION OF THE DRAWINGS

FIG. 10b-1 is a more detailed view of a pixelated, reflective surface of the embodiments of FIG. 10b or 10c, and shows the preferred orientation variations and grating period variations for different types of pixelated reflective surfaces;

FIG. 10c-1 depicts piston actuated mirrors which may be used with the embodiments of FIG. 10b or 10c.

DETAILED DESCRIPTION

Various embodiments of the present invention are shown in FIGS. 3, 4, 5, 6, 7, 8, 9, 10, 10a, 10b, 10b-1 and 10c. In these figures, retro-modulators using cat's eye as well as corner cube structures as the basic retroreflective configurations are shown. The (binary) modulation can be encoded using four different methods, which can be integrated into these two (cat's eye and corner cube) basic retroreflective structures: (1) deflection of the optical beam using compact MEMS cantilevers; (2) diffraction of the beam using switchable grating structures; (3) reflection of the beam using binary switchable Fabry-Perot elements; (4) switching of an optical beam using a moveable bubble in a TIR (total internal reflection) binary set of states.

Figure 3:
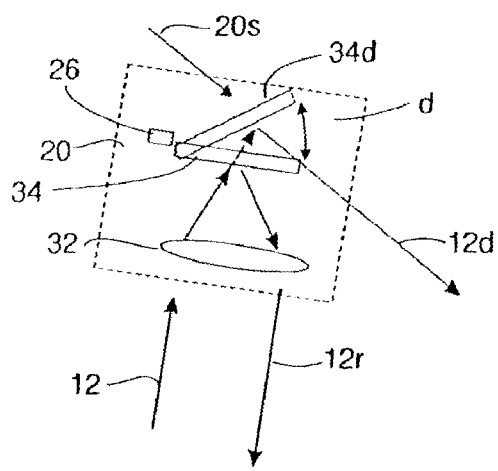
FIG. 3 shows a cat's eye retro-reflector with compact MEMS cantilever to provide modulation encoding.

FIGS. 3, 4, 5 and 8 show examples of embodiments using cat's eye devices. FIG. 3 shows an embodiment using a cat's eye retro-device with a small MEMS cantilever device 26 placed at the backplane 34 of a lens or diffractive element 32. The cantilever device 26 can be driven (electro-statically, optically or thermally) to deflect the beam into one of two different angular states by moving the back plane 34 to location 34d, so that the return beam can be effectively modulated. Typically, the MEMS device 26 is driven by an electrical or an optical signal on line 20s. Without a signal, a "normal" retro-direction is realized (as indicated by the presence of reflected beam 12r) and in the presence of the drive voltage (in the case of a non-optical MEMS device embodiment), the retro-direction 12r is defeated and the non-retro direction 12d is instead realized. Of course, the sense of the two states can be inverted, if desired. Such cantilevers 26 can be relatively small (10 μm scale size) so that operation at high modulation rates (kHz and above) can be realized and low modulation powers need be applied. Large arrays of these basic cantilevers (all in a plane, and without a retro-device) have been employed for spatial light modulators for display mode applications.

Figure 4:
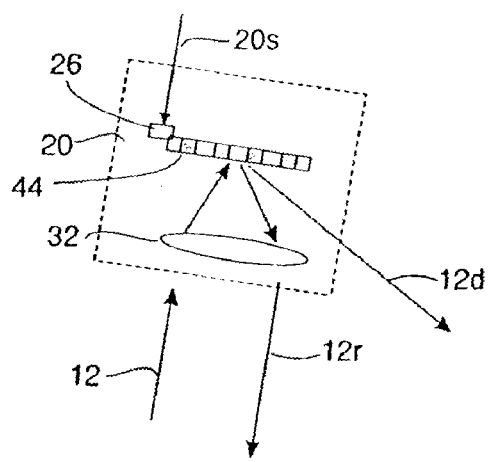
FIG. 4 depicts a cat's eye retro-modulator using a binary, switchable grating element for encoding.
Figure 4A:
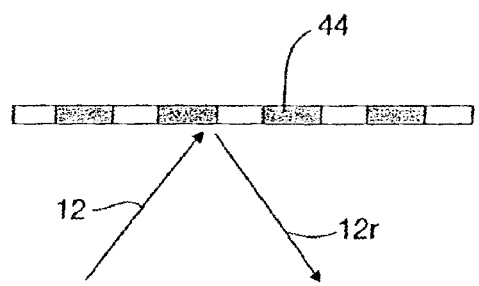
FIGS. 4a and 4b show the switchable grating element used in the embodiment of FIGS. 4 and 6 in greater detail and in two positions of diffraction and specular reflection, respectively.
Figure 4B:
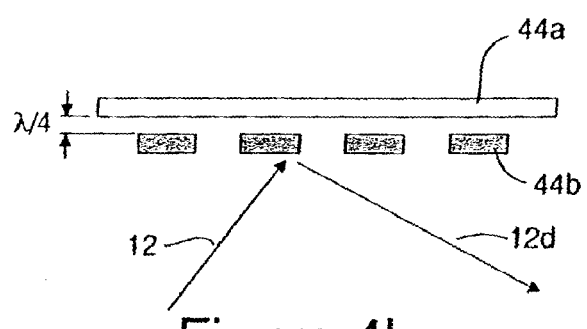

FIG. 4 shows an alternate embodiment using a cat's eye retroreflector, but, now with a binary, switchable grating structure 44 shown in greater detail in FIGS. 4a and 4b. With the signal or voltage off (on line 20s), the grating 44b is in the plane of the substrate 44a, so that a specular reflection is realized in direction 12r (in FIGS. 4a and 4b lens 32 is omitted for ease of illustration); but with an applied signal or voltage on line 20s, the grating 44b now is above (in a direction towards the source of the incident beam 12 as shown by FIG. 4b) the surface and diffracts the incident beam 12 over an angle beyond the retro-direction to the non-retro direction 12d. Note that the required displacement of the grating 44b from the substrate 44a need only be in the range of $\lambda/4$ (where $\lambda$ is a wavelength of the incident beam 12), so that small drive signals and drive powers are required for the MEMS device 26 to effect the needed movement and thereby allow modulation to be applied to beam 12 (on beam 12r) by device 20. Large arrays of these basic gratings (all in a plane, and without a retro-device) have been employed for spatial light modulators for display mode applications.

Figure 5:
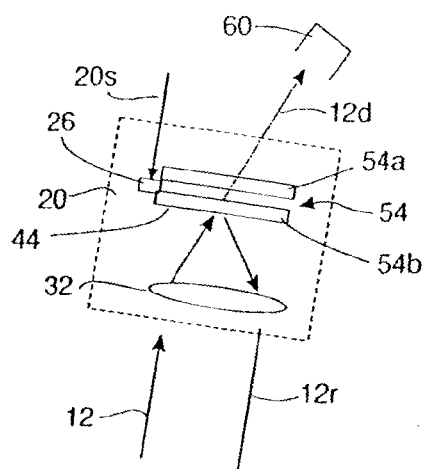
FIG. 5 shows a cat's eye retro-modulator using a MEMS binary switchable Fabry-Perot element for encoding.

FIG. 5 shows a cat's eye device with a switchable MEMS-based optical filter 54 to provide the modulation. A two-mirror Fabry-Perot filter 54 is configured using a pair of compact reflecting elements 54a, 54b so that in one state, it reflects the desired beam 12r, whereas in the other state, the beam is transmitted through the optical cavity as beam 12d. One or both of the compact reflecting elements 54a, 54b is positioned by at least one MEMS device 26. The two-mirror Fabry-Perot filter 54, which is known per se in the prior art, is shown in greater detail by FIGS. 5a and 5b. By displacing the pair of MEMS reflecting elements from a spacing $L_1$ (see FIG. 5a) to a spacing $L_2$ (see FIG. 5b) between reflecting elements 54a, 54b, the beam can be switched. Displacements as small as 100 nm (0.1 micron) have been demonstrated for WDM applications, resulting in a very small drive voltage relative to typical (microns) MEMS-based displacement devices. The system 20 is configured so that the reflected beam 12r completes the retro-mode, whereas the transmitted beam 12d does not. This device 20 may not have a limited field of view, dictated by the angular dependence of the Fabry-Perot cavity spectral response.

Figure 8:
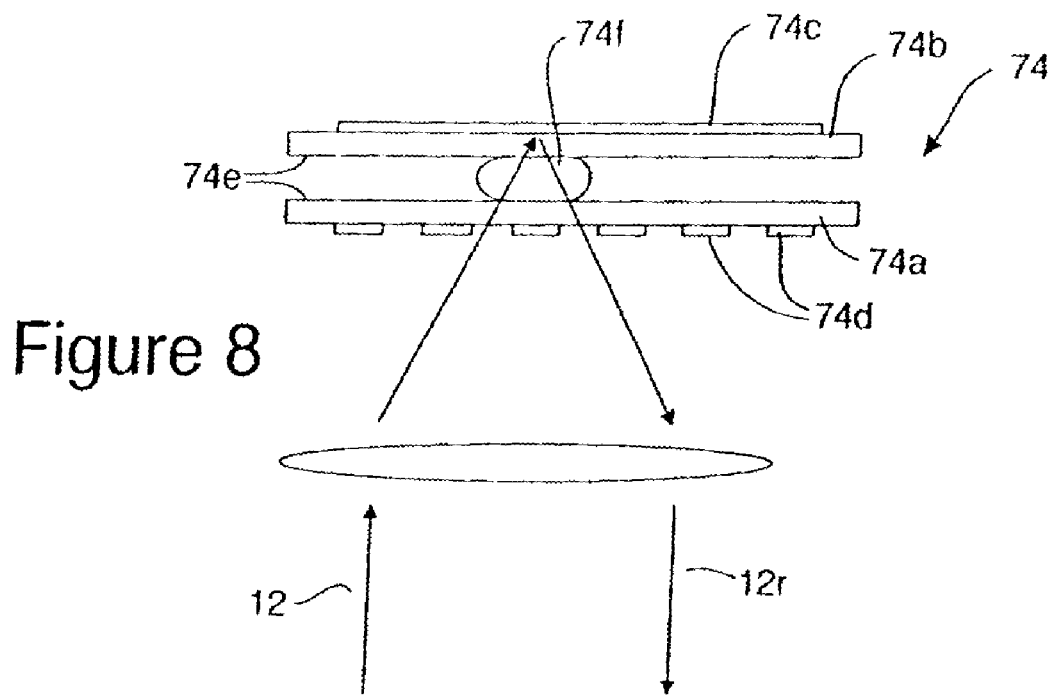
FIG. 8 depicts an embodiment of a cat's eye retro-reflector which utilizes a moveable bubble in a TIR (total internal reflection) device.

FIG. 8 depicts a TIR device 74 arranged as a cat's eye retro reflector. The TIR device 74 includes a moveable bubble 74f placed between a pair of glass or Si substrates 74a & 74b, forming a three-element structure, as is shown by FIG. 8. This bubble 74f, when positioned (thermally, electrostatically, etc.) along the path of the optical beam 12, enables transmission of the beam through the three-element structure 74a, 74f, 74b since it preferably has an index of refraction the same as that of the substrates 74a, 74b. When the bubble is positioned out of the path of beam 12, the incident beam 12 experiences total internal reflection (TIR), and is scattered onto many different directions. Substrate 74b has a conductive and reflective surface 74c on its rear surface for reflecting beam 12 after it passes through bubble 74f.

The bubble can be controlled (moved) by imparting electrical signals between transparent electrodes 74d on the surface of substrate 74a and the conductive surface 74c. An electric field between one of the electrodes 74d and surface 74c will attract bubble 74f.

The internally facing surfaces 74e of substrates 74a and 74b are preferably etched to cause the total internal reflection (TIR) to occur when the bubble 74f is not in way of the beam 12. However, when bubble 74f has been urged to fall within the path of beam 12, it effectively wets those portions of the etched surfaces 74e in way of the beam 12 allowing the beam to pass easily through the bubble 74f and reflect off surface 74c.

Figure 9:
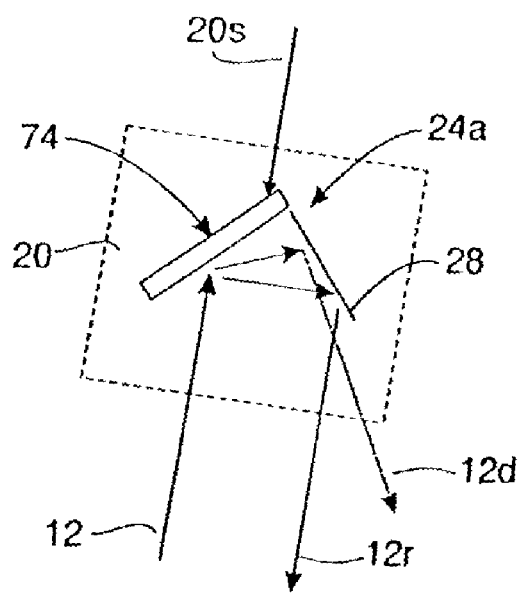
FIG. 9 depicts an embodiment of a corner cube retro-reflector which utilizes a moveable bubble in a TIR device.

This binary switching device 74 can be incorporated into either the cat's eye device, as shown in FIG. 8, or, as will be seen, into the corner cube retro-reflector as shown by FIG. 9.

Figure 6:
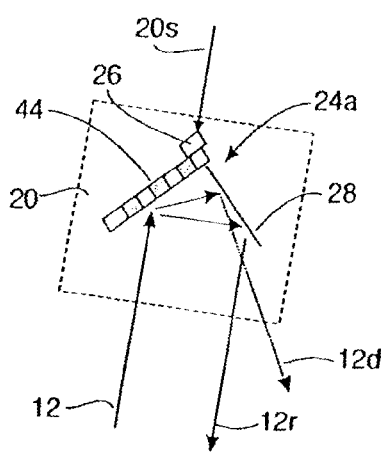
FIG. 6 illustrates a corner cube retro-modulator using a binary MEMS switchable grating (see FIGS. 4(a) and 4(b) for a more detailed view of the grating) for encoding.

FIGS. 6, 7, 9 and 10 show embodiments using corner cubes as the basic retro-reflecting device. FIG. 6 depicts an embodiment employing a corner cube retro-reflector 24a which has one mirror 28 of a normal corner cube reflector replaced with a switchable grating structure 44 (see FIGS. 4a and 4b). The device 24a is configured so that with the grating 44 in an off state, a specular return is realized on path 12r via mirror 28, thereby providing the corner cube's retro capability. With an applied signal voltage on line 20s, the grating now diffracts the incident beam 12 preferably beyond the diffraction-limited retro-angle in a direction 12d. The grating structure 44 is used as a diffractive element (i.e., effectively a reflector), which can be raised or lowered (in-plane or out-of-plane) to deflect or not deflect the incident beam in the retro-direction 12r, resulting in an effective binary modulation of the retro-reflected beam 12r. Note that a very small displacement ($\lambda/4$) is required, as compared with a conventional mirror element for a MEMS controlled corner cube, whose required deflection may be a factor of 5 or more times greater than that necessary by the embodiments using MEMS devices disclosed herein.

Figure 5A:
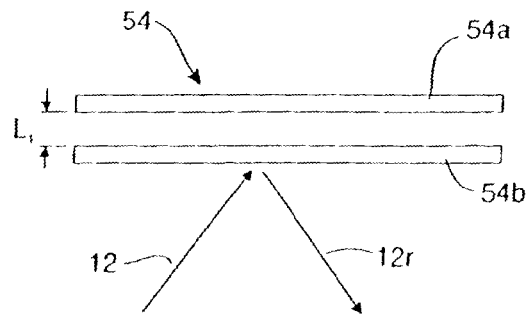
FIGS. 5a and 5b show the switchable Fabry-Perot element used in the embodiment of FIG. 5 in greater detail and in two positions of transmission and specular reflection, respectively.
Figure 5B:
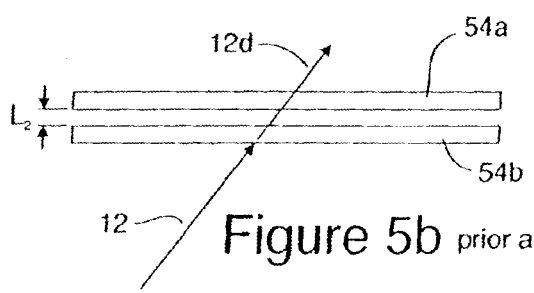
Figure 7:
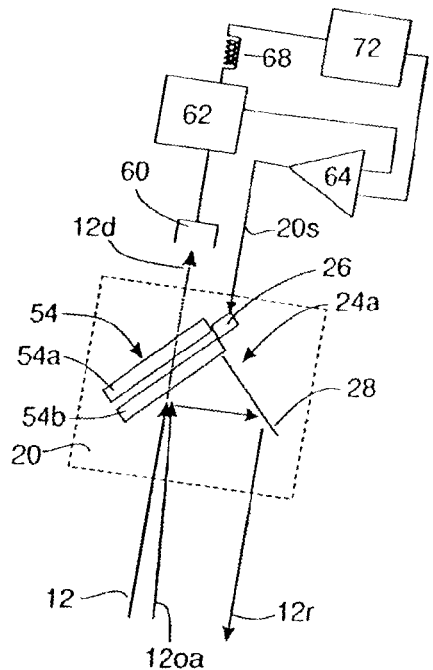
FIG. 7 depicts a corner cube retro-modulator using a binary MEMS Fabry-Perot element (see FIGS. 5(a) and 5(b) for a more detailed view of the MEMS Fabry-Perot element) for encoding.

FIG. 7 shows a corner cube embodiment using a switchable Fabry-Perot filter 54 as the binary-encoded modulation element (see FIGS. 5a and 5b). The Fabry-Perot filter 54 has MEMS 26 controlled mirrors 54a, 54b Here, the reflected state of the filter 54 is used to realize a retro-return beam 12r via mirror 28, whereas the transmitted state provides for the off state by passing the incident beam 12 as beam 12d.

A detector 60 (see FIGS. 5 and 7) can be provided to easily detect the presence of incident beam 12, which is useful in a communications application of the present invention such as that shown by U.S. provisional patent application Ser. No. 60/420,177 mentioned above. In such an embodiment, the Fabry-Perot devices of FIG. 5 or 7 could be substituted for the Fabry-Perot Multiple Quantum Well devices of U.S. provisional patent application Ser. No. 60/420,177 mentioned above, for example.

The detector 60 can also detect information encoded on the incident beam 12. The encoded information, in addition to data, can include a high frequency jitter on the data. When detector 60 is in a detection mode, then the Fabry-Perot device 54 is passing incident signal 12 as opposed to absorbing incident signal 12. The jitter can be used to test how well the Fabry-Perot device is passing the incident signal since the high frequency jitter can be detected and decoded to determine whether the Fabry-Perot device 54 is optimally tuned or whether it is slightly off frequency. For example, the plates 54a and 54b could be 1) properly spaced, 2) too close or 3) too far apart. The analog signal output by detector 60 can be analyzed by a control system 62 to determine whether the plates are properly spaced. If not, then a DC control voltage output by the control system 62 can be applied via an operational amplifier 64 to the MEMS device 26 to adjust (increase or decrease) the spacing of plates 54a, 54b appropriately. The data signal on line 20s becomes active whenever the device is used to transmit data on the return beam 12r. The received data is passed via a low pass filter 68 to a computer 72 for decoding the incident data and for generating the transmitted data on 20s.

The light 12d passing through to the detector 70 can be utilized to adjust (fine tune) the Fabry-Perot device 54 to compensate for:

(1) wavelength changes in beam 12;
(2) thermal effects (expansion, etc of the system);
(3) light arriving off the axis of beam 12 (see the off-axis beam 12oa). The Fabry-Perot device 54 has a wide field of view, so it can "see" beam 12oa, but its plates 54a, 54b might then be improperly spaced for beam 12oa since the light of beam 12oa will travel farther within device 54 than would the light of beam 12.

The control system 62 can be used to help compensate for such issues by detecting the high frequency jitter. If control system is not used, then the Fabry-Perot device may be slightly mistuned, thereby decreasing its sensitivity somewhat.

In the case of the embodiments of FIGS. 3-9, the reflected beam 12r is generally co-incident with the incident beam 12 and would normally be separated therefrom, for detection purposes, at a location remote from apparatus 20 using a beam splitter 16 (previously discussed with reference to FIG. 1) and the split-off beam would then be detected using a detector 18 (also previously discussed with reference to FIG. 1).

The aforementioned corner cube embodiments of FIGS. 6, 7 and 9 have all been depicted with preferably two planar surfaces, namely a mirrored surface 28 and a surface 44, 54 or 74 whose reflection abilities can be altered in response to an electrical signal 20s. Surface 44, 54 or 74 will hereinafter be referred to generically as an electrically controllable reflective surface. Additionally, corner cube devices can have two or three nominally reflective surfaces and, moreover, one, two or all such surfaces can be implemented as an electrically controllable reflective surface whose reflection abilities can be altered in response to an electrical signal 20s.

Figure 10:
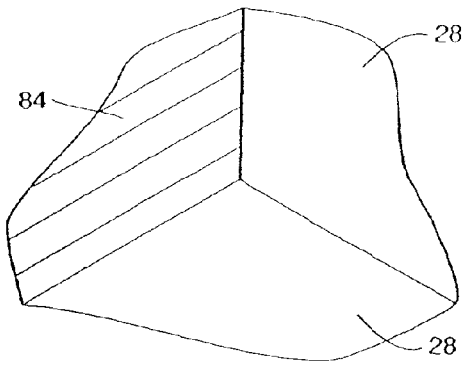
FIG. 10 depicts an embodiment of a corner cube retro-reflector with three mirrored surfaces each disposed orthogonally with respect to each other, with one of the mirrored surfaces being an electrically controllable reflective surface.

FIG. 10 depicts a corner cube with three mirrored surfaces each disposed orthogonally with respect to each of the other two mirrored surfaces. In this embodiment, two surfaces 28 are preferably simple mirrors while one surface is an electrically controllable reflective surface 84. The electrically controllable reflective surface 84 is depicted with parallel lines to reflect the fact that this surface may well have gratings associated therewith, as shown in FIGS. 4a, 4b, and 8.

Figure 10A:
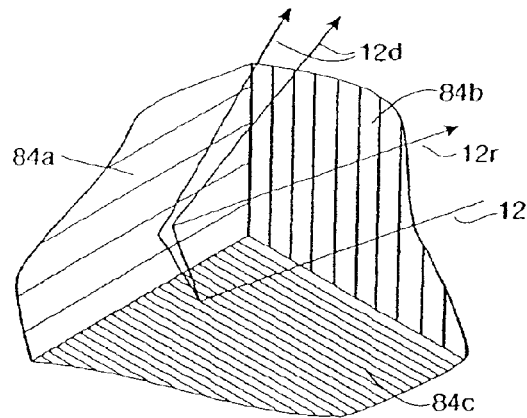
FIG. 10a depicts an embodiment of a corner cube retro-reflector with three mirrored surfaces each disposed orthogonally with respect to each other, with more than one of the mirrored surfaces being an electrically controllable reflective surface.

FIG. 10a is similar to FIG. 10, but in this embodiment all three mirrored surfaces are implemented as electrically controllable reflective surfaces 84. In this embodiment the electrically controllable reflective surfaces are labeled 84a, 84b and 84c. Of course, surfaces 84a, 84b and 84c are each disposed orthogonally with respect to each of the other two surfaces. The spacings of the parallel lines differ for each of the surfaces 84a, 84b and 84c to reflect the fact that the spacings or intervals of their gratings 44, if used, need not be the same for each surface 84a, 84b and 84c. Indeed, it is preferable that such spacings or intervals be different as that should help break up a deflected beam 12d and help make it even less detectable.

FIG. 10b is again similar to FIG. 10, but in this case one of the mirrored surfaces is implemented by an electrically controllable reflective surface 84 which is pixelated, as is represented by the grid pattern shown on surface 84 of FIG. 10*b*. A pixelated electrically controllable reflective surface 84 can be implemented as a grid or array of pixelated electrically controllable reflective elements 94. Each element 94 can be implemented as a MEMS controlled device of the type, for example, previously discussed with reference to FIG. 2*a*, 4 or 5 or by a MEMS element whose moveable arm is coupled to a small mirrored surface 96 (see FIG. 10*c*-1). If the individual elements 94 are implemented as moveable gratings as shown in FIGS. 4, 4*a* and 4*b*, then the gratings 44 of neighboring elements 94 in pixelated surface 84 are preferably disposed at angles relative to each other as shown in the more detailed view of FIG. 10*b*-1 and are preferably implemented with different grating periods.

Figure 1:
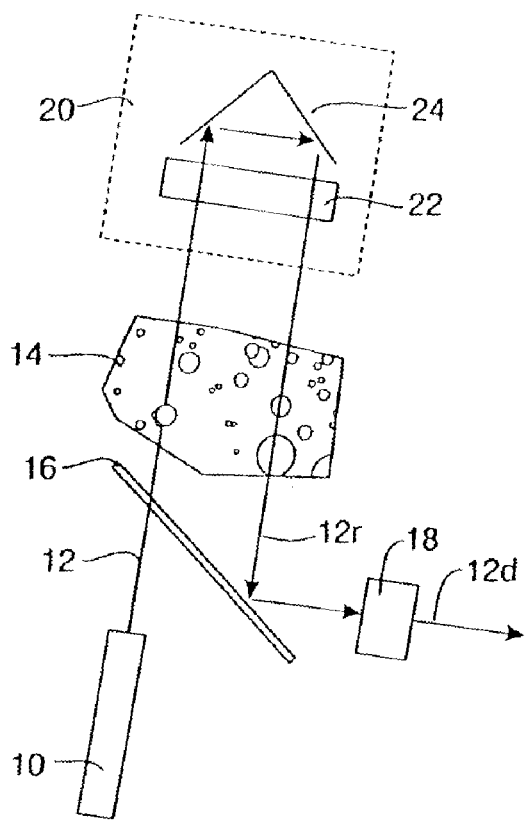
FIG. 1 depicts a conventional retro-modulator with external modulation element.
Figure 2A:
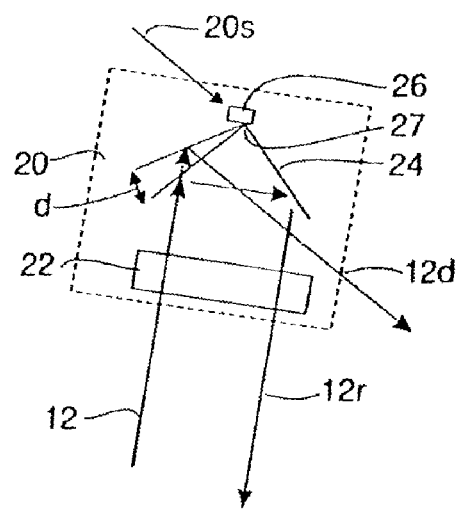
FIG. 2a depicts a conventional MEMS corner cube with mirror deflector.
Figure 2B:
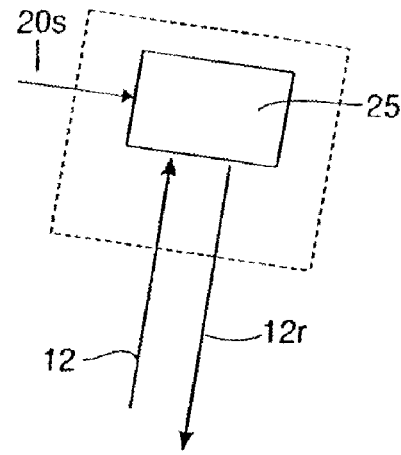
FIG. 2b depicts a conventional phase-conjugate mirror with modulation capability.
Figure 10B:
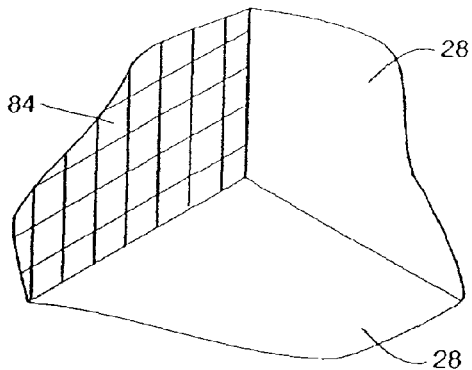
FIG. 10b depicts an embodiment of a corner cube retro-reflector with three mirrored surfaces each disposed orthogonally with respect to each other, with one of the mirrored surfaces being an electrically controllable pixelated reflective surface.

If the individual elements 94 are implemented with small mirrors that can be tilted as shown in FIG. 2*a*, the tilt axes 27 for neighboring elements 94 are preferably disposed at angles and adjacent different edges of the neighboring elements 94, again as represented in FIG. 10*b*-1.

Alternatively, a pixelated electrically controllable reflective surface 84 can be implemented by a spatial light modulator (SLM), which functions as a spatial phase modulator in a monolithic package.

Figure 10C:
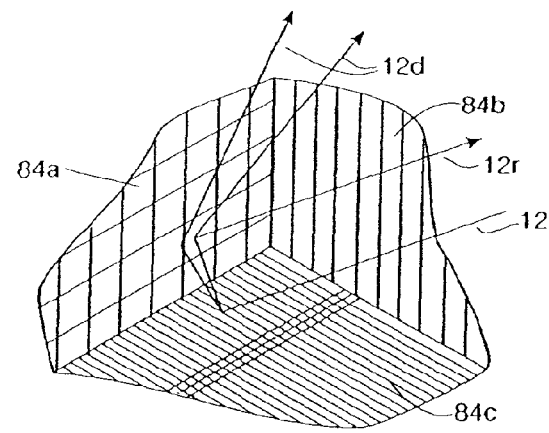
FIG. 10c depicts an embodiment of a corner cube retro-reflector with three mirrored surfaces each disposed orthogonally with respect to each other, with one of the mirrored surfaces being an electrically controllable pixelated reflective surface and the other mirrored surfaces being electrically controllable.
Figures 1, 10B:
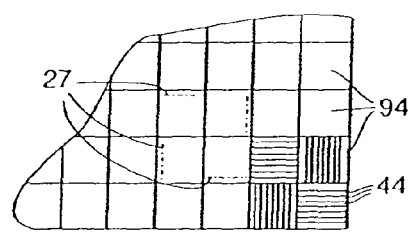
Figures 1, 10C:
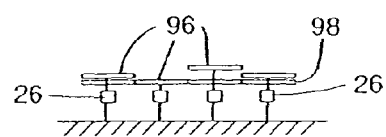

FIG. 10*c* is similar to FIG. 10*b*, but in this embodiment the remaining two mirror surfaces of the embodiment of FIG. 10*b* are here depicted as electrically controllable reflective surfaces 84 which have associated gratings or may also be pixelated (as represented by the dashed lines on one of the three surfaces 84). The incident beam 12, the return beam 12*r* and the deflected beam(s) 12*d* are also depicted in this Figure.

The spacings (periods) of the gratings preferably fall in the range of about 1-100 μm. Due to the Bragg condition, the smaller the grating period, the larger the angle by which a reflected beam is reflected away from its usual (for a planar surface) angle of reflection. However, the corner reflector will also have some dispersion associated with its reflected beams, including beams 12*r* and 12*d*, due to aperture effects. The deflected beam(s) 12*d* should preferably be deflected by a greater angle from beam 12*r* than that which would be attributable to normal aperture effects so that an interrogating beam 12 sees little or no reflection(s) during a portion of the time the beam is being modulated (for example when the amplitude of the modulating signal is at its maximum (or minimum)) to increase the contrast ratio between beams 12*r* and 12*d* as the incoming light is modulated by the corner cube device.

FIG. 10*c*-1 depicts mirrors 96 which are moved in a piston-like fashion relative to neighboring mirrors 96 (keeping the associated mirrors in parallel planes as opposed to tilted as done when the embodiment of FIG. 2*a* is used with the embodiment of 10*b*). The individual mirrors 96 are moved by MEMS devices 26 and when the MEMS devices 26 are unactuated, the mirrors preferably align in a planar configuration 98. The size of the piston-like minors 96 are also preferably in the range of 1-100 μm on a side for the same reasons as given above. If tilting mirrors are used, then they can each fill or occupy one of the elements 84 in the array.

In FIG. 10*c*-1 only four mirrors 96 are shown for ease of illustration, it being understood that the mirrors 96 would preferably be arranged in a large two dimensional array of mirrors 96.

Generally speaking, the larger the number of elements 84 in an array, the better the array is in causing a greater number of deflected beams 12*d* to be generated during modulation, but with a downside of increasing the cost of the corner cube device due to the fact that the number of MEMS devices will similarly increase (assuming that there is one MEMS device, for example, associated with each pixel 84). In a military application, for example, it may well be that one does not want some undesirable third party trying to read the deflected beam 12*d*. By throwing the deflected beams 12*d* in thousands (for example) of different directions, the amount of light headed in any particular direction that is off the normal retro-reflection axis of the return beam 12*r* is reduced considerably, thereby making it more difficult for an undesirable third party to try to eavesdrop on the deflected beam(s) 12*d*.

The MEMS devices discussed above are described as being electrically controlled, which is the conventional manner for controlling MEMS devices. However, optically controlled MEMS devices are known in the art and the MEMS devices used in the disclosed embodiment could be either electrically or optically controlled. When array(s) of pixelated electrically controllable reflective elements are utilized, then the individual reflective elements in the array can be controlled either by a common control signal or by individual control signals.

Having described this invention in connection with a number of embodiments, modification will now certainly suggest itself to those skilled in the art. As such, the invention is not to be limited to the disclosed embodiments except as required by the appended claims.

The invention claimed is:

1. A method of retro-reflecting and modulating an optical beam comprising:
   a. providing a retro-reflecting structure having at least one moveable optical element for selectively reflecting the optical beam impinging the retro-reflecting structure, the moveable optical element having the moveable optical element having a first position in which the retro-reflecting structure retro-reflects the optical beam and having a second position in which the retro-reflecting structure does not retro-reflect the optical beam, the first and second positions being spaced by a distance less than a wavelength of the optical beam; and
   b. moving said at least one moveable optical element in response to a modulation signal to thereby modulate the optical beam as a modulated retro-reflected beam.

2. The method of claim 1 wherein the retro-reflecting structure includes at least a pair of reflective surfaces, at least one of said reflective surfaces comprising the at least one optical element which is moved less than a wavelength of the optical beam in order to modulate the retro-reflected beam.

3. The method of claim 2 wherein the at least a pair of reflective surfaces are arranged in a cat's eye configuration.

4. The method of claim 2 wherein the at least a pair of reflective surfaces are arranged in a corner cube configuration with at least one mirrored surface.

5. The method of claim 1 wherein the retro-reflecting structure includes a substrate and a grating structure, at least one of said substrate and said grating structure comprising the at least one optical element which is moved less than a wavelength of the optical beam in order to modulate the retro-reflected beam.

6. The method of claim 5 wherein the substrate and grating structure are arranged in either a cat's eye or a corner cube configuration.

7. The method of claim 5 wherein the substrate and grating structure comprise multiple substrate and grating structures arranged in corner cube configuration.

8. The method of claim 7 wherein the corner cube configuration has multiple reflective faces with each face comprising a plurality of grating structure pixels, with each pixel being rotated relative to a neighboring pixel.

9. The method of claim 1 wherein the retro-reflecting structure comprises a corner cube with multiple reflective faces, at least one of the multiple reflective faces having at least one grating structure which comprises the at least one moveable optical element.

10. The method of claim 9 wherein the at least one of the multiple reflective faces have a plurality of grating structures disposed in a grid and wherein neighboring ones of the grating structures in the grid have different grating periods.

11. A method of controllably retro-reflecting light, the method comprising;
   providing a plurality of mirrored surfaces arranged orthogonally with respect to each other and wherein at least one of said mirrored surfaces is physically controlled for modifying reflection characteristics of said at least one of said mirrored surfaces whereby a beam of light is retro-reflected by the retroreflector when said at least one of said mirrored surfaces is in a first light reflecting mode and wherein said beam of light is not retro-reflected by the retroreflector when said at least one of said mirrored surfaces is in a second light reflecting mode; and
   physically controlling the at least one of said mirrored surfaces in response to a modulation signal to modulate said light.

12. The method of claim 11 further including providing a micromechanical device for moving at least one of the reflective surfaces of said pair of reflective surfaces relative to another one of the reflective surfaces of said pair of reflective surfaces a distance which causes the pair of the reflective surfaces to switch between a reflective mode of operation and a transmissive mode of operation, the micromechanical device being responsive to said modulation signal.

13. The method of claim 11 wherein said at least one of said mirrored surfaces includes at least one structure comprising a substrate, a moveable grating structure and a micromechanical device for moving the moveable grating structure relative to the substrate to cause the at least one structure to switch between a retro-reflective mode of operation of the retroreflector and a non-retro-reflective mode of operation of the retroreflector, the micromechanical device being responsive to said modulation signal to impart modulation to an optical beam which is retro-reflected from the at least one structure.

14. The method of claim 11 further including disposing a plurality of said reflecting structures in an array, the reflecting structures being responsive to said modulation signal for causing the reflecting structures to switch between a retro-reflective mode of operation of the retroreflector and a non-retro-reflective mode of operation.

15. The method of claim 14 further including switching the reflecting structures between a retro-reflective mode of operation of the retroreflector and a non-retro-reflective mode of operation of the retroreflector by tilting the reflecting structures arranged in said array.

16. The retroreflector of claim 11 wherein said at least one of said mirrored surfaces is a pixelated mirrored surface with individual MEMS devices for controlling individual mirrors disposed in an array which defines said pixelated mirrored surface.

* * * * *